(12) United States Patent
Mayer Pujadas et al.

(10) Patent No.: US 11,827,158 B2
(45) Date of Patent: Nov. 28, 2023

(54) RADOME FOR VEHICLES

(71) Applicant: Zanini Auto Grup, S.A., Parets del Valles (ES)

(72) Inventors: Augusto Mayer Pujadas, Parets del Valles (ES); Josep Maria Armengol I Rocaspana, Parets del Valles (ES); Jerson Jair Peralta Morales, Parets del Valles (ES)

(73) Assignee: Zanini Auto Grup, S.A., Parets del Valles (ES)

( * ) Notice: Subject to any disclaimer, the term of this patent is extended or adjusted under 35 U.S.C. 154(b) by 383 days.

(21) Appl. No.: 16/307,543

(22) PCT Filed: Jun. 9, 2016

(86) PCT No.: PCT/EP2016/063173
§ 371 (c)(1),
(2) Date: Dec. 6, 2018

(87) PCT Pub. No.: WO2017/211419
PCT Pub. Date: Dec. 14, 2017

(65) Prior Publication Data
US 2019/0143909 A1 May 16, 2019

(51) Int. Cl.
*B60R 13/00* (2006.01)
*H01Q 1/32* (2006.01)
(Continued)

(52) U.S. Cl.
CPC .......... *B60R 13/005* (2013.01); *C23C 14/081* (2013.01); *C23C 14/14* (2013.01);
(Continued)

(58) Field of Classification Search
CPC ..... B60R 13/005; C23C 14/081; C23C 14/14; C23C 14/35; G01S 13/931; G01S 7/032;
(Continued)

(56) References Cited

U.S. PATENT DOCUMENTS 9,419,333 B1 * 8/2016 Muench ................ C04B 41/009
9,494,679 B2    11/2016 Keckes
(Continued)

FOREIGN PATENT DOCUMENTS

DE    102011016683    4/2011
EP        1560288    8/2005
(Continued)

OTHER PUBLICATIONS

International Search Report an Written Opinion issued on PCT/EP2016/063173, dated Feb. 17, 2017.

*Primary Examiner* — Timothy X Pham
(74) *Attorney, Agent, or Firm* — Bell & Manning, LLC

(57) ABSTRACT

The radome (10) for vehicles comprises a substrate (18) formed of a radio transmissive resin, the substrate (18) having a proximal face and a distal face and a decoration layer (20) applied to the proximal face, the decoration layer (20) comprising a metalloid or a metalloid alloy deposited on the surface of the proximal face, wherein said metalloid or metalloid alloy is combined with at least one oxide. It improves the metalloid decoration layer adhesion on the substrate and its corrosion resistance.

8 Claims, 3 Drawing Sheets

(51) Int. Cl.
*H01Q 1/42* (2006.01)
*C23C 14/08* (2006.01)
*C23C 14/14* (2006.01)
*C23C 14/35* (2006.01)
*G01S 13/931* (2020.01)
*G01S 7/03* (2006.01)

(52) U.S. Cl.
CPC ............ *C23C 14/35* (2013.01); *G01S 13/931* (2013.01); *H01Q 1/3233* (2013.01); *H01Q 1/3283* (2013.01); *H01Q 1/42* (2013.01); *H01Q 1/422* (2013.01); *H01Q 1/425* (2013.01); *G01S 7/032* (2013.01); *G01S 2013/93271* (2020.01)

(58) Field of Classification Search
CPC .. G01S 2013/93271; G01S 2013/9375; H01Q 1/3233; H01Q 1/3283; H01Q 1/422; H01Q 1/425
See application file for complete search history.

(56) References Cited

U.S. PATENT DOCUMENTS

| | | | |
|---|---|---|---|
| 2010/0207842 A1* | 8/2010 | Kawaguchi | C23C 14/205 343/907 |
| 2011/0273356 A1* | 11/2011 | Kawaguchi | C23C 14/35 343/873 |
| 2012/0119961 A1* | 5/2012 | Mayer Pujadas | H01Q 1/38 343/713 |
| 2017/0307724 A1* | 10/2017 | Park | G01S 13/931 |
| 2017/0352938 A1* | 12/2017 | Okumura | G01S 7/02 |
| 2018/0254551 A1* | 9/2018 | Guretzky | G01S 7/032 |

FOREIGN PATENT DOCUMENTS

| | | |
|---|---|---|
| EP | 2383364 | 11/2011 |
| JP | 2003252137 | 9/2003 |
| WO | WO2012/066417 | 5/2012 |

* cited by examiner

RADOME FOR VEHICLES

CROSS REFERENCE TO RELATED APPLICATION

This application is a National Stage of International Application No. PCT/EP2016/063173, filed Jun. 9, 2016, the contents of which are incorporated herein by reference.

The present invention refers to a radome for protecting a radar device while presenting a decorative metallic image, especially for radar devices disposed behind the front grill of an automobile.

BACKGROUND OF THE INVENTION

In general, radio transmitter-receiver devices, such as a millimeter-wave radar, have been employed as sensors for vehicular collision avoidance and adaptive cruise control systems.

In a radar system or the like that measures obstacles in front of an automobile and the distance between automobiles, the antenna was preferably positioned in the center at the front of the vehicle to obtain maximum performance. Although the radar antenna could be installed near the front grill of automobile, it was preferable to conceal the antenna from view due to its non-aesthetic appearance and to shield the antenna from external environmental factors such as weather and airborne contaminants.

In order to protect the antenna and avoid radio interference and signal losses of the radar device, it has been proposed to provide a radar window capable of transmitting radio waves in the front grill corresponding where the radar antenna was located. This allowed radio waves to pass in and out through the window. However, the radar window diminished the appearance of the front grill due to the interruption of the pattern of the grill structural elements. Further, unsightly internal portions of the vehicle, like the radar transmitter-receiver, could be seen through the radar window.

In U.S. Pat. No. 6,328,358 unity between the radar window and the front grill body was provided. The radar window as disclosed in U.S. Pat. No. 6,328,358 was formed by laminating a plurality of resin layers formed with concavity and convexity. This component provided an impression by a metal layer deposited with concavity and convexity between the resin layers such that the fin member of the front grill appeared to extend across the radar window without interruption.

Indium was used as a metal deposited in such radar window. When depositing indium on a deposit member, indium was not deposited on the surface in a uniform film manner, but deposited in a nanometric insular manner. In other words, when indium was deposited on the deposit member, the surface of the deposit member comprised a nanometric combination of a deposit portion where indium was deposited in an insular manner and a non deposit portion where nothing was deposited.

In this case, radio waves could pass in and out through the non-deposit portion and the surface of the deposit member could be recognized upon viewing as a member that had metallic luster, since the deposit portion had indium deposited in a nanometric insular manner.

This selective way of deposition complicated the process of application of the indium metals. Further radio waves did not pass in and out satisfactorily when the deposit portions were formed extremely close together. The conductivity of the metals required the use of low density evaporation methods such as thermal evaporation. These methods did not guarantee a uniform deposition in thickness throughout the member or between members produced in the same batch. Other methods of deposition would guarantee uniform insular deposition such sputtering, but sputtering provided a metal density that generates a high level of attenuation, making the system useless for a radome application in front of a radar antenna.

U.S. Pat. No. 6,328,358 discloses a thin metallic layer comprising indium deposited on a metal portion area that could be viewed from the outside at a plastic-plated member for the beam path of a radar device. However, it was necessary to ensure a bright design and the reliability of durability for radio transmittance by forming a stable protective layer so as not to allow the indium bright film layer to undergo exfoliation or be damaged by an external force, or to be corroded by an external environmental stress such as water or polluted air.

This was due to the following: indium is a very soft metallic material with a value of 1.2 in the Mohs hardness scale; indium corrodes under the aforementioned environmental stress since it is basically a metallic material; it is necessary to ensure the reliability of durability by securing the film thickness with certainty such that the bright-effect design of indium can be obtained without thickening the indium film layer more than is necessary, since a radio transmission loss occurs as a conductivity loss based on the fact that indium is basically a metallic material; and the indium layer melts due to the heat of molten resin when successively conducting secondary formation of the lining resin on a resin-molded component in which a film is formed on the surface of a base body in advance, since the melting point of indium is 156° C., which is extremely low, for example.

Although indium film is suitable for a film of an emblem or the like as it shows a metallic color, it poses problems in that it readily experiences exfoliation and lacks durability and abrasion resistance. Also, indium film may corrode, since it is basically a metal. Thus, when a ceramic film comprising silicon dioxide is disposed, the durability is improved and the film, or paint, can be protected. However, the ceramic film comprising silicon dioxide is colorless, so that the appearance of a metallic color, for example, cannot be provided.

WO2012066417A1, in the name of the same applicant than the present application, discloses a decorative radome comprising a substrate made of a radio transmissive resin, a decoration layer comprising a plurality of metalloid or metalloid alloy (Si, Ge) layers applied to the substrate proximal face, a radio transmissive resin overlying the decoration layer, the resin overlying the decoration layer including a decoration ink overlay.

Some aesthetic limitations arise given the limited number of metalloids. Metals such as Aluminum, Chromium, Tin or Silver are used in the vehicle as reference or applied for color matching, and metalloids provide different tones so color matching is not always only attained with decoration described in this document.

Therefore, the object of the present invention is to overcome these limitations, providing other advantages that will be disclosed hereinafter.

SUMMARY OF THE INVENTION

The radome for vehicles according to the present invention comprises a substrate formed of a radio transmissive resin, the substrate having a proximal face and a distal face and a decoration layer applied to the proximal face, the decoration layer comprising a metalloid or a metalloid alloy deposited on the surface of the proximal face, characterized in that said metalloid or metalloid alloy are combined with at least one oxide.

It must be pointed out that the decoration layer can be formed only from, or consist of, a metalloid or a metalloid alloy with one or more oxides.

Preferably, said oxide(s) is(are) selected from Titanium (Ti), Vanadium (V), Chromium (Cr), Manganese (Mn), Zirconium (Zr), Niobium (Nb), Molybdenum (Mo), Hafnium (Hf), Tantalum (Ta), Tungsten (W), Iridium (Ir), Nickel (Ni), Platinum (Pt), Silicon (Si), Silver (Ag), Indium (In), Thallium (Tl), Gallium (Ga) or Aluminium (Al), and said metalloid or the metalloids of the alloy are selected from Silicon, Boron, Germanium, Arsenic, Antimony and/or Tellurium.

Furthermore, the radome for vehicles according to the invention further includes preferably a radio transmissive resin layer overlying the decoration layer, and the resin layer can include a decoration ink overlay.

Advantageously, the metalloid or metalloid alloy combined with said oxide(s) is deposited on the surface of the proximal face by means of any suited Physical Vapor Deposition (PVD) or Chemical Vapor Deposition (CVD) processes.

The present invention also refers to a vehicle including a radome as defined previously, including a front grill assembly, the radome being positioned within the grill assembly, the vehicle further including a radar antenna positioned behind and in registration with the radome.

Said drawbacks can be overcome by the use of oxides. These oxides are applied combined with metalloids or metalloid alloys.

With the radome according to the present invention, the following advantages can be provided:
the metalloid decoration layer adhesion on the substrate is improved;
the metalloid decoration layer corrosion resistance is improved;
the metalloid decoration layer metallic tone is enhanced to match other vehicle metallic decorated parts;
oxides also possess low electric conductivity, so distortion they introduce to electromagnetic waves is negligible.

DESCRIPTION OF A PREFERRED EMBODIMENT

Figure 1:
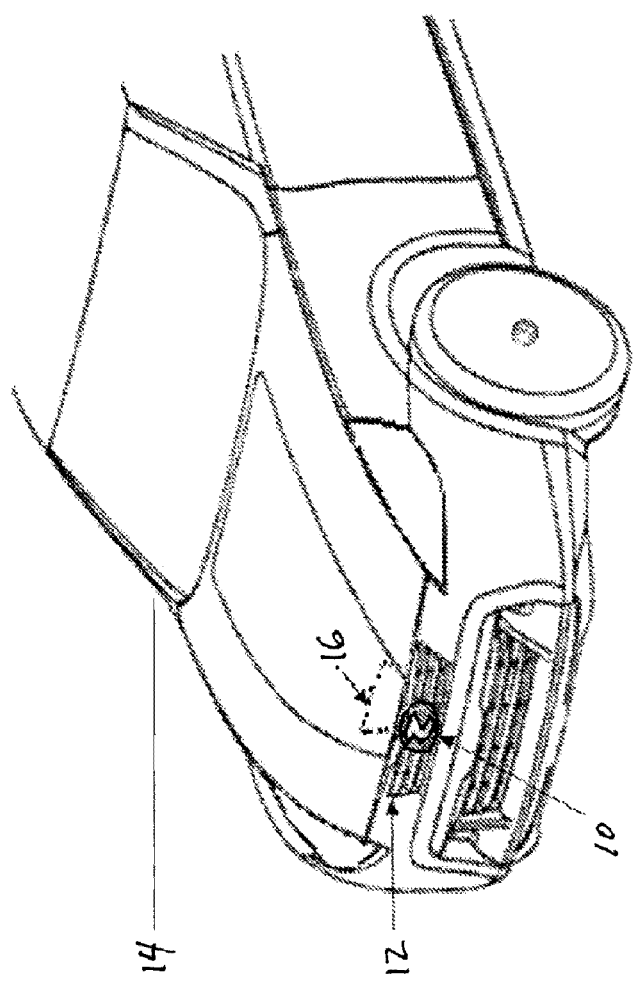
FIG. 1 is a fragmentary isometric view of a vehicle having a decorative radome constructed in accordance with and embodying the invention positioned within a grill assembly and a radar antenna positioned behind the radome.

First of all, in the present specification and in the attached claims by the term "metalloid" is meant any of the following compounds: Silicon, Boron, Germanium, Arsenic, Antimony and/or Tellurium.

Furthermore, in the present specification and in the attached claims by the term "oxide" is meant any of the following oxides: $Ti_xO_y$, $V_xO_y$, $Cr_xO_y$, $MnO_xO_y$, $Zr_xO_y$, $Nb_xO_y$, $Mo_xO_y$, $Hf_xO_y$, $Ta_xO_y$, $W_xO_y$, $Ir_xO_y$, $Ni_xO_y$, $Pt_xO_y$, $Ag_xO_y$, $In_xO_y$, $Tl_xO_y$, $Si_xO_y$, $Ga_xO_y$ or $Al_xO_y$, i.e. oxides comprising Titanium (Ti), Vanadium (V), Chromium (Cr), Manganese (Mn), Zirconium (Zr), Niobium (Nb), Molybdenum (Mo), Hafnium (Hf), Tantalum (Ta), Tungsten (W), Iridium (Ir), Nickel (Ni), Platinum (Pt), Silver (Ag), Indium (In), Thallium (Tl), Silicon (Si), Gallium (Ga) or Aluminium (Al).

Radomes cover microwave antennas to protect the antennas from rain, ice, wind and other environmental conditions and are also provided to conceal the antennas form view. A principal requirement is that the radome be transparent to radar or radio waves or provide but minimal signal attenuation and/or distortion.

The present invention relates to the use of a metalloid or metalloid alloy including one or more oxides for a radome. The present invention employs, for example, as a radome decoration layer, germanium or silicon combined with an oxide, a metalloid of high electric resistivity, i.e. 1 ohm m at 20° C.

Due to the high melting point of germanium 938.25° C. (or silicon 1414° C.) and its boiling point 2833° C. (3265° C. for silicon), this element cannot be deposited using thermal evaporation methods like the ones applied in the case of indium. Nevertheless, this constitutes an advantage.

According to the present invention, Physical Vapor Deposition (PVD) or Chemical Vapor Deposition (CVD) are the possible methods employed for the deposition of metalloid and oxide layers over a substrate comprising a base layer or body. Due to the deposition process of these techniques, uniformity of the decoration layer can be guaranteed.

The decorative radome for automotive vehicular applications of the present invention comprises a molded radome having a base layer or body composed of a resin and a bright decoration layer on the surface of the base layer or body, the bright decoration layer being composed of a metalloid, such as, germanium boron, silicon, arsenic, antimony or tellurium and/or a metalloid alloy combined with one or more oxides.

By using the layer of metalloid and/or metalloid alloy, and oxide, radio transmittance can be improved by several orders of magnitude as compared with an indium layer or other metals such as, tin, as proposed in EP 1560288 A2.

The high conductivity of metals like indium or tin, combined with the variability of thickness of the deposition methods typically used, required each radar window to be tested for radar beam transmissivity during the final stage of production. This increased dramatically the manufacturing cost of the radome.

The very low conductivity of a metalloid combined with oxide layer of the present invention, allows one to avoid the requirement for testing of each radome.

Due to the fact of using a combined metalloid plus oxide layer, it not necessary to create areas where no metallic decoration is applied, since such a layer performs like a dielectric with respect to radar waves. This reduces process complexity in the manufacturing of the radome of the present invention, as compared with the method exemplified in patent JP 2003-252137A.

With reference now in detail to the drawings, wherein like numerals will be employed to denote like components throughout, as illustrated in FIG. 1, the reference numeral 10 denotes generally a decorative radome constructed in accordance with and embodying the invention configured for mounting within a grill assembly 12 of a motor vehicle 14.

Positioned within the vehicle 14 behind and in registration with the decorative radome 10 is a radar antenna 16.

Figure 2:
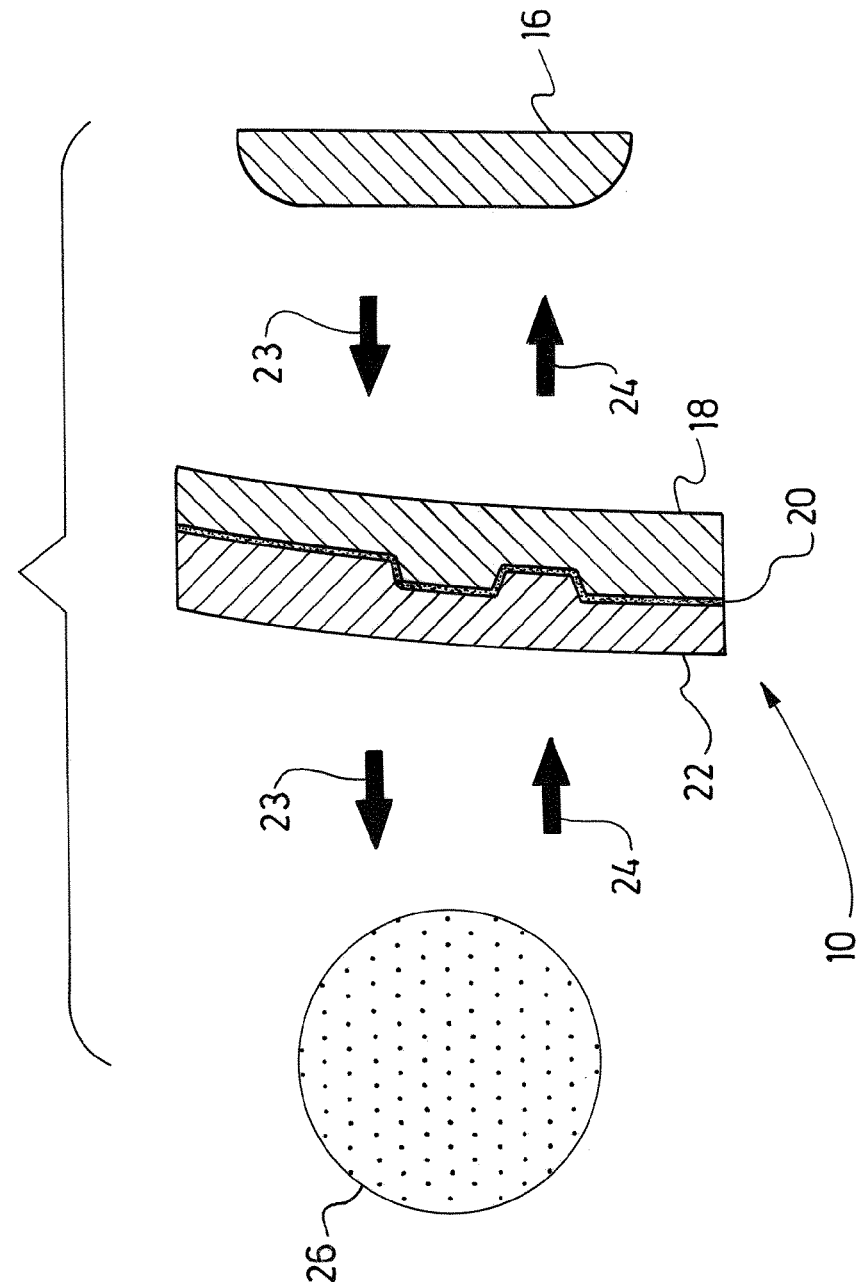
FIG. 2 is a schematized sectional view through a portion of the radome positioned within the grill and showing the radar antenna positioned within the vehicle behind the radome and with a detected object in front of the vehicle, with a schematized representation of emitted and reflected radar waves.
Figure 3:
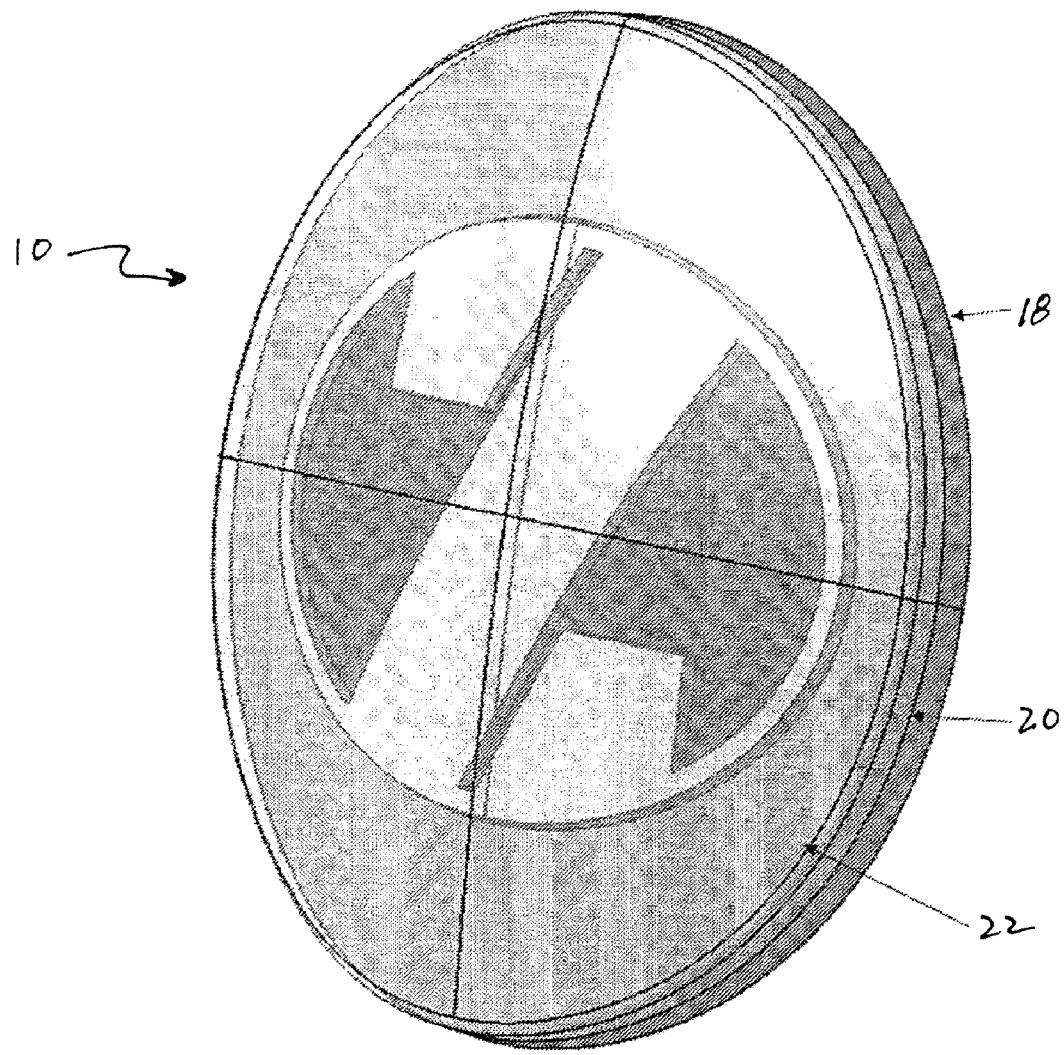
FIG. 3 is an isometric view of the radome showing a base layer, a decoration layer and a protective cover layer.

FIG. 2 comprises a cross section of the radome 10 and illustrating the beam path of a radar antenna according to the present invention. Preferably, a substrate comprising a layer or base body 18 having a proximal face and a distal face is molded of a transparent or nontransparent resin having low radio transmission loss or a resin resulting in low dielectric loss. On the surface of the proximal face, a bright decoration layer 20 comprising metalloid and/or a metalloid alloy including at least one oxide.

Pursuant to the invention, the decoration layer 20 is of uniform thickness. Ornamentation, such as a vehicle emblem, is provided by shaping the proximal face of the base layer or body 18 with projecting and or indented surface configurations.

The decorative radome 10 according to the present invention can further include a transparent resin layer 22 which overlies the decoration layer 20 for adapting the complete body to the mill metric wave semi wave length resulting in a lower attenuation for the radar waves. The resin layer 22 may be molded over the base body 18 and decoration layer 20 and may include, on its distal face, a decorative ink overlay complementing the ornamental appearance of the decoration layer 20.

The base layer or body 18 is composed of a material that provides low radio transmission loss and is superior in terms of dielectric properties. Relative permittivity E' and dielectric loss tan 0, for example, provide an indication of the dielectric property.

As previously mentioned, the radar antenna 16 is mounted in an automobile 14 and disposed behind the front grill assembly 12. The decorative radome 10, which includes a bright metallic emblem of an automobile manufacturer or a specific decoration, is disposed within the front grill assembly 12.

With reference to FIG. 2, it will be observed that millimeter waves 23 from the radar device 16 are radiated forward through the radome 10 and reflection waves 24 from an object 26 return to the radar device 16 through the radome 10.

The decorative layer 20 may be formed of a plurality of metalloid and/or metalloid alloy and at least one oxide strata or alternating strata of metalloid and metalloid alloy with each strata having a thickness in the order of 1 nm to 500 nm, and more preferably with a total thickness in the order of 10 nm to 100 nm believed to be the most efficient in achieving the objectives of the present invention and for obtaining metallic color effects.

Further the decorative layer may comprise alternating strata of one metalloid and/or metalloid alloy and at least one oxide and strata of another metalloid.

Thus, it will be seen that there is provided a decorative radome for automotive applications which achieves the various aspects, features and considerations of the present invention and which is well suited to meet the conditions of practical usage.

EXAMPLES

A possible, non-limiting example of decoration on the proximal face of the substrate is a plurality of metalloid layers comprising Silicon and Germanium, and a plurality of oxide deposited layers from following elements: Titanium (Ti), Vanadium (V), Chromium (Cr), Manganese (Mn), Zirconium (Zr), Niobium (Nb), Molybdenum (Mo), Hafnium (Hf), Tantalum (Ta), Tungsten (W), Iridium (Ir), Nickel (Ni), Platinum (Pt), Silver (Ag), Indium (In), Thallium (Tl), Silicon (Si), Gallium (Ga) or Aluminium (Al).

More preferably following layer combinations are suitable: Titanium dioxide ($TiO_2$)+Silicon dioxide ($SiO_2$), Titanium dioxide ($TiO_2$)+Germanium dioxide ($GeO_2$), Niobium pentoxide ($Nb_2O_5$)+Silicon dioxide ($SiO_2$), Niobium pentoxide ($Nb_2O_5$)+Germanium dioxide ($GeO_2$), Chromium oxide ($Cr_2O_3$)+Silicon dioxide ($SiO_2$), Chromium oxide ($Cr_2O_3$)+Germanium oxide ($GeO_2$), Hafnium oxide ($HfO_2$)+Silicon dioxide ($SiO_2$), Hafnium oxide ($HfO_2$)+Germanium dioxide ($GeO_2$), Zirconium dioxide ($ZrO_2$)+Silicon dioxide ($SiO_2$), Zirconium dioxide ($ZrO_2$)+Germanium dioxide ($GeO_2$), Since various possible embodiments might be made of the present invention and since various changes might be made in the exemplary embodiment shown herein without departing from the spirit of the invention, is to be understood that all matter herein described or shown in the accompanying drawings is to be interpreted as illustrative and not in a limiting sense.

The invention claimed is:

1. A radome (10) for vehicles, comprising a substrate (18) formed of a radio transmissive resin, the substrate (18) having a proximal face and a distal face and a decoration layer (20) applied to the proximal face, the decoration layer (20) comprising a metalloid or a metalloid alloy deposited on the surface of the proximal face, wherein the metalloid or metalloid alloy combined with at least one oxide is deposited on the surface of the proximal face by physical vapor deposition (PVD) magnetron sputtering, characterized in that the at least one oxide is a binary compound, wherein the radome is configured to protect a radar device, and wherein the at least one oxide includes oxygen and another component; and a radio transmissive resin layer (22) overlying the decoration layer (20).

2. The radome (10) for vehicles according to claim 1, wherein said oxide(s) include Titanium (Ti), Vanadium (V), Chromium (Cr), Manganese (Mn), Zirconium (Zr), Niobium (Nb), Molybdenum (Mo), Hafnium (Hf), Tantalum (Ta), Tungsten (W), Iridium (Ir), Nickel (Ni), Platinum (Pt), Silver (Ag), Silicon (Si), Indium (In), Thallium (Tl), Gallium (Ga) and/or Aluminium (Al).

3. The radome (10) for vehicles according to claim 1, wherein said metalloid or the metalloids of the alloy are selected from Silicon, Boron, Germanium, Arsenic, Antimony and/or Tellurium.

4. The radome (10) for vehicles according to claim 1, wherein the resin layer (22) includes a decoration ink overlay.

5. Vehicle (14) including a radome (10) according to claim 1, including a front grill assembly (12), the radome (10) being positioned within the grill assembly (12), the vehicle (14) further including a radar antenna (16) positioned behind and in registration with the radome (10); and a radio transmissive resin layer (22) overlying the decoration layer (20), wherein the metalloid or metalloid alloy combined with said oxide(s) is deposited on the surface of the proximal face by means of PVD magnetron sputtering.

6. The vehicle of claim 5, wherein said oxide(s) include Titanium (Ti), Vanadium (V), Chromium (Cr), Manganese (Mn), Zirconium (Zr), Niobium (Nb), Molybdenum (Mo), Hafnium (Hf), Tantalum (Ta), Tungsten (W), Iridium (Ir), Nickel (Ni), Platinum (Pt), Silver (Ag), Silicon (Si), Indium (In), Thallium (Tl), Gallium (Ga), and/or Aluminum (Al).

7. The vehicle of claim 5, wherein said metalloid or the metalloids of the alloy are selected from Silicon, Boron, Germanium, Arsenic, Antimony and/or Tellurium.

8. The vehicle of claim 1, wherein the radio transmissive resin layer (22) includes a decoration ink overlay.

\* \* \* \* \*